United States Patent
Hao et al.

(10) Patent No.: US 6,977,134 B2
(45) Date of Patent: Dec. 20, 2005

(54) MANUFACTURING METHOD OF A MOSFET GATE

(75) Inventors: Chung-Peng Hao, Taipei (TW);
Hui-Min Mao, Tainan Hsien (TW);
Yi-Nan Chen, Taipei (TW); Tzu-Ching Tsai, Taichung Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 235 days.

(21) Appl. No.: 10/452,274

(22) Filed: Jun. 2, 2003

(65) Prior Publication Data

US 2003/0232285 A1    Dec. 18, 2003

(30) Foreign Application Priority Data

Jun. 12, 2002    (TW) ............................... 91112776 A

(51) Int. Cl.⁷ .............................................. G03C 5/00
(52) U.S. Cl. ...................... 430/311; 430/314; 430/316; 430/317; 430/319
(58) Field of Search ...................... 430/311, 314, 316, 430/317, 319

(56) References Cited

U.S. PATENT DOCUMENTS

| | | | |
|---|---|---|---|
| 6,403,483 B1 * | 6/2002 | Hao et al. ................... | 438/692 |
| 2001/0046777 A1 * | 11/2001 | Kim et al. .................. | 438/702 |
| 2004/0092073 A1 * | 5/2004 | Cabral et al. ............... | 438/287 |

* cited by examiner

Primary Examiner—John A. McPherson
Assistant Examiner—Daborah Chacko-Davis
(74) Attorney, Agent, or Firm—Quintero Law Office

(57) ABSTRACT

A manufacturing method for a MOSFET gate structure. The method comprises providing a substrate, sequentially depositing a pad layer and a dielectric layer thereon, defining a gate trench passing through the dielectric layer and the pad layer to expose a predetermined gate area of the substrate, sequentially forming a gate dielectric layer, a first conductive layer, a second conductive layer, and a cap layer on the exposed substrate in the gate trench to form a damascene gate structure, and removing the dielectric layer.

26 Claims, 5 Drawing Sheets

MANUFACTURING METHOD OF A MOSFET GATE

BACKGROUND OF THE INVENTION

1. Field of the Invention

The present invention relates to a method of manufacturing semiconductor integrated circuits. More particularly, the present invention relates to a method of manufacturing a damascene MOSFET (metal oxide semiconductor field effect transistor) gate structure.

2. Description of the Related Arts

Recently, as the manufacturing techniques of semiconductor integrated circuits develop, the number of elements in a chip has increased. The gate length of the transistor has scaled down to less than 100 nm, with the gate oxide thickness usually less than 3 nm. The conventional manufacturing method for a MOSFET gate structure comprises forming a shallow trench isolation (STI) composed of silicon dioxide on a silicon substrate to define an active area, forming a gate oxide layer and a polysilicon layer sequentially, covering the polysilicon layer with a hard mask, defining a polysilicon gate by photolithography and etching, performing implantation of the lightly doped drain, and forming sidewall spacers.

The conventional manufacturing method usually utilizes repeated processes of deposition, photolithography and etching; however, the production of hard masks is costly. With the need for more precise element, the gate manufacturing method becomes more difficult. In addition, over-etching of the oxide layer may result in damage to the underlying silicon substrate when the polysilicon layer and oxide layer are removed from the non-gate area. Accordingly, the uneven surface of the substrate may cause poor contact in subsequent process. If the etching step is not completed, a gate to gate or gate to bitline stringer may appear, and short circuit may occur. There is still a need to solve the aforementioned drawbacks of the conventional manufacturing method.

SUMMARY OF THE INVENTION

It is therefore a primary object of the present invention to provide a manufacturing method for a damascene MOSFET gate structure.

In one aspect of the present invention, a manufacturing method for a damascene MOSFET gate structure comprises providing a substrate, sequentially depositing a pad layer and a dielectric layer thereon, defining a gate trench passing through the dielectric layer and the pad layer to expose a predetermined gate area of the substrate, sequentially forming a gate dielectric layer, a gate conductive layer, and a cap layer on the exposed substrate to form a damascene gate structure in the gate trench, and removing the dielectric layer.

In one preferred embodiment, the gate dielectric layer is Al2O3 oxide or HfO3 oxide formed by CVD, PVD, or MBE. The conductive layer is polysilicon, or metal such as Al or Mo.

In the other aspect of the invention, the manufacturing method for a damascene MOSFET gate structure comprises providing a substrate, sequentially forming a pad layer and a dielectric layer thereon, defining a gate trench passing through the dielectric layer and the pad layer to expose a predetermined gate area of the substrate, sequentially forming a gate dielectric layer, a first gate conductive layer, a second gate conductive layer, and a cap layer on the expoxed substrate in the gate trench to form a damascene gate structure, and removing the dielectric layer.

In another aspect of the present invention, the manufacturing method for a damascene MOSFET gate structure comprises providing a silicon substrate, sequentially forming a pad layer and a dielectric layer thereon, defining a gate trench passing through the dielectric layer and the pad layer to expose a predetermined gate area of the substrate, sequentially forming a gate dielectric layer, a first gate conductive layer, a second gate conductive layer, and a cap layer on the expoxed substrate in the gate trench to form a damascene gate structure, wherein the damascene gate structure is formed by forming a gate dielectric layer, filling the gate trench with a first conductive layer and recessing the same to leave a damascene first conductive layer, filling the gate trench with a second conductive layer and recessing the same to leave a damascene second conductive layer, and filling the gate trench with a cap layer and recessing the same to leave a damascene cap layer, and removing the dielectric layer.

BRIEF DESCRIPTION OF THE DRAWINGS

The present invention will be more fully understood and further advantages will become apparent when reference is made to the following description of the invention and the accompanying drawings in which.

DETAILED DESCRIPTION OF THE INVENTION

Without intending to limit it in any manner, the present invention will be further illustrated by the following description.

Figure 1:
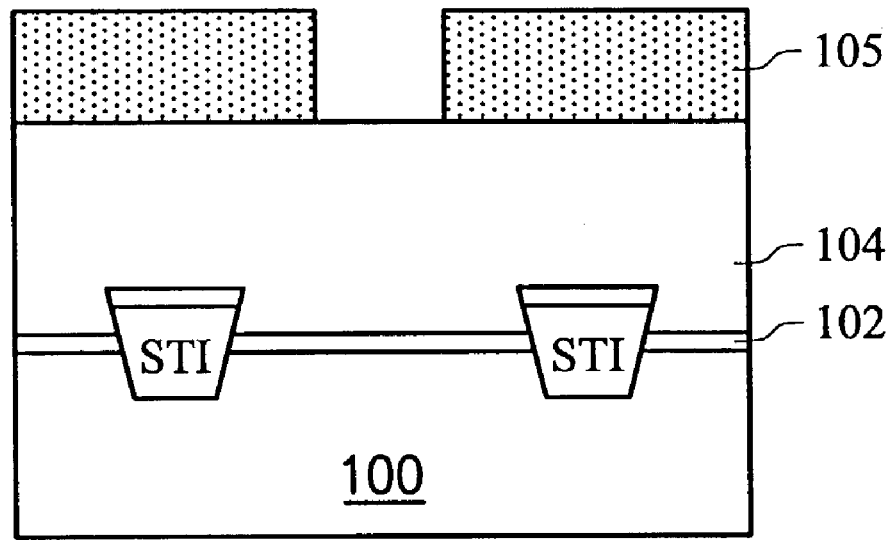
FIGS. 1–10 are a series of cross sections showing a preferred embodiment of the present invention.
Figure 2:
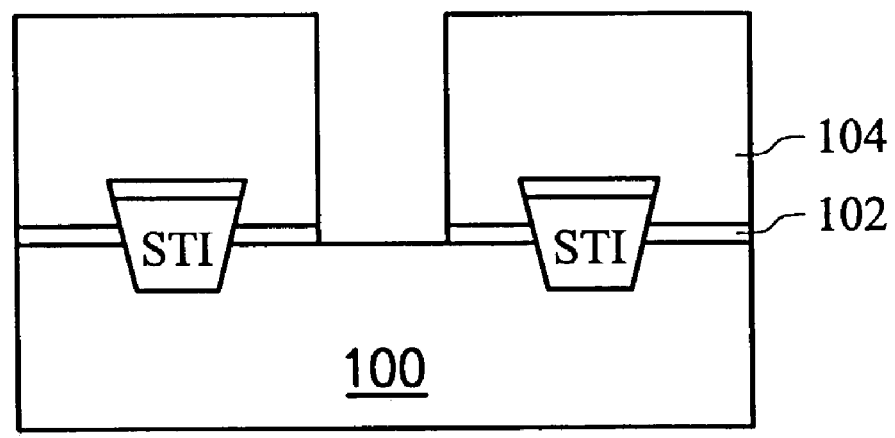

As shown in FIG. 1, a silicon substrate 100 is provided and a STI composed of silicon dioxide formed thereon to define an active area. Next, a pad layer 102 is then deposited on the silicon substrate 100. The pad layer comprises a pad oxide on the silicon substrate and a pad nitride on the pad oxide. A dielectric layer 104 composed of tetra-ethyl-orthosilicate (TEOS) is then deposited on the pad layer 102. The pad layer 102 and the dielectric layer 104 are formed by chemical vapor deposition (CVD) or thermal oxidation. Next, a photoresist layer 105 is coated on the dielectric layer 104 and patterned using photolithography to define a predetermined gate area. A gate trench passing through the dielectric layer 104 and the pad layer 102 is formed by etching to expose the substrate 100 where the gate is to be formed, as shown in FIG. 2.

Figure 3:
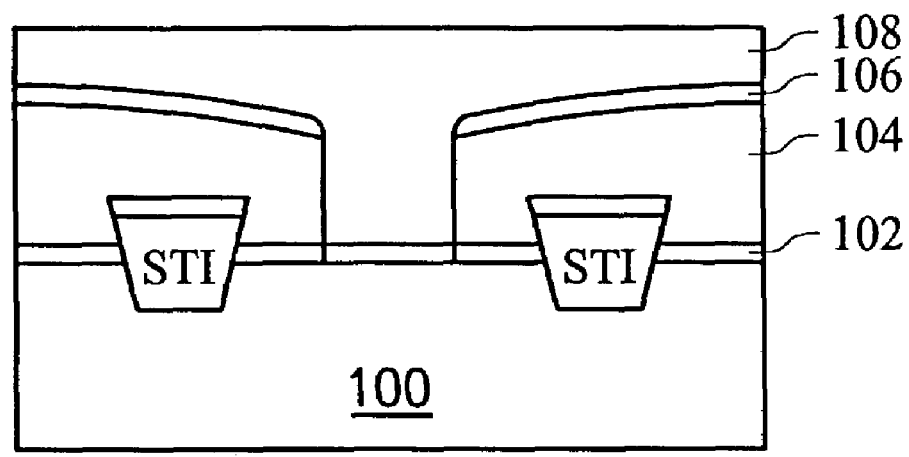

Next, as shown in FIG. 3, a thin gate dielectric layer 106 is formed by CVD, PVD, or MBE. The gate dielectric layer 106 can be $Al_2O_3$ oxide or $HfO_2$ oxide. A N-type polysilicon layer 108 is formed as a first conductive layer. The polysilicon layer 108 can be deposited by low-pressure CVD (LPCVD) at 525~575° C., and the thickness of the polysilicon layer 108 is 1000~5000 Å. For N-type device, phosphine or arsine can be added to silane gas to perform in situ dopping while the polysilicon layer 108 is deposited, or phosphorous ion or arsenic ion is implanted after the deposition of the polysilicon layer 108. The implantation energy is 25~75 KeV, and the concentration is 1E14~1E16 atoms/$cm^2$.

Figure 4:
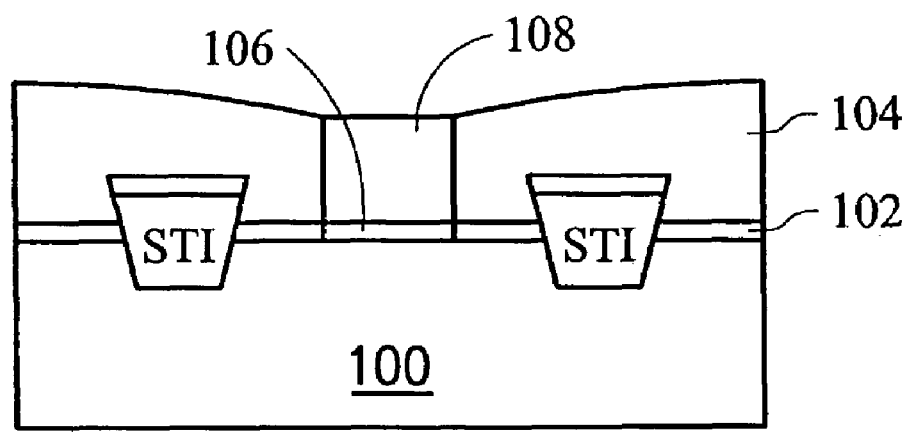

After that, as shown in FIG. 4, planarzation is performed on the polysilicon layer 108 by chemical mechanical polishing (CMP).

Figure 5:
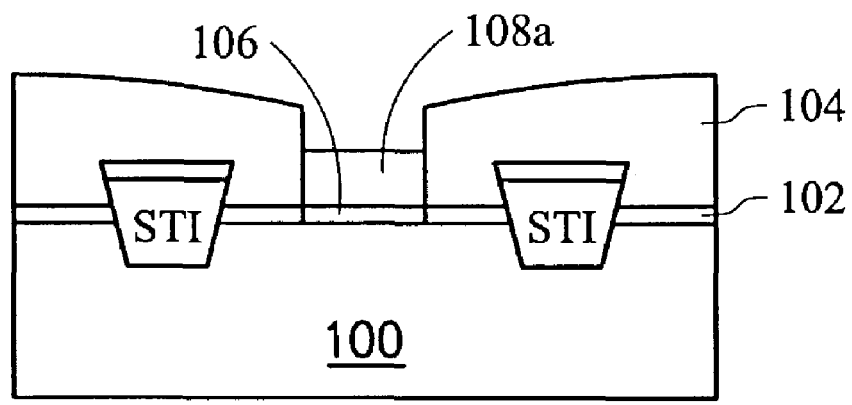

Next, as shown in FIG. 5, the polysilicon layer 108 is etched back to lower the surface of the polysilicon layer 108 below the predetermined gate trench to obtain a damascene structure. The etching gas used herein contains $Cl_2$ to selectively remove the polysilicon. The surface of the polysilicon layer 108, lower than the predetermined gate trench is for filling tungsten silicide (WSi) in subsequent process. In addition, the polysilicon gate 108a can be defined on the predetermined gate area.

Figure 6:
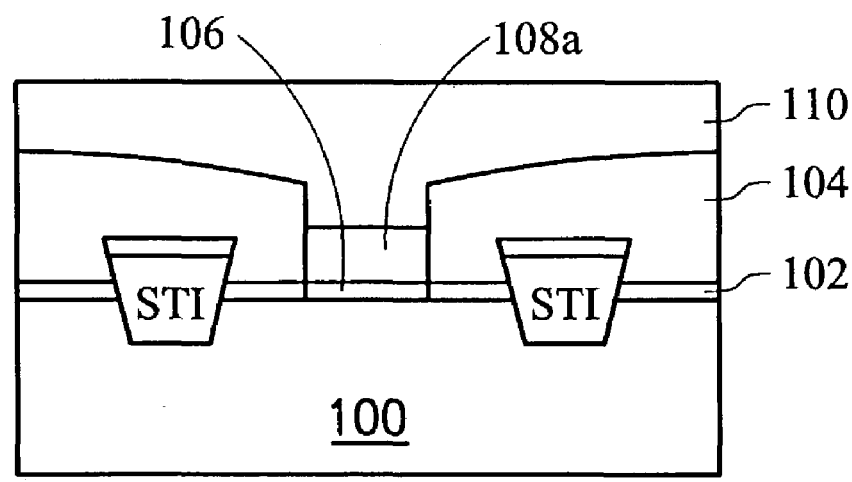

Afterwards, as shown in FIG. 6, a thin tungsten silicide ($WSi_x$) layer 110 is deposited as a second conductive layer by plasma enhanced chemical vapor deposition (PECVD), sputtering, or preferably CVD.

Figure 7:
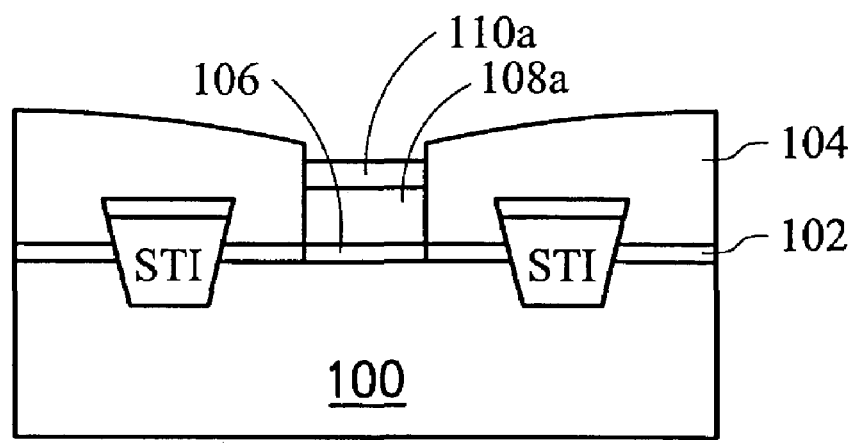

Next, as shown in FIG. 7, planarzation is performed on the thin $WSi_x$ layer 110 to obtain a damascene structure 110a by CMP and etching, or etching alone. The thin $WSi_x$ layer 110a and the polysilicon layer 108a together form a damascene gate conductive layer, and the polysilicon layer 108a as the first conductive layer is thicker than the $WSi_x$ layer 110a as the second conductive layer. The other combination of gate conductive layer can be the polysilicon layer as the first conductive layer and tungsten nitride/tungsten layer as the second conductive layer with the first conductive layer thicker than the second conductive layer.

Figure 8:
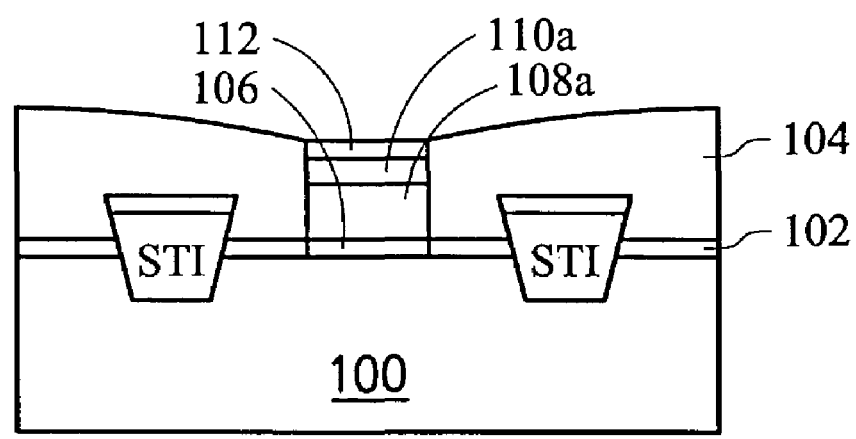

Next, as shown in FIG. 8, a thin nitride layer 112 is deposited and treated with CMP or etching to obtain a damascene structure.

Figure 9:
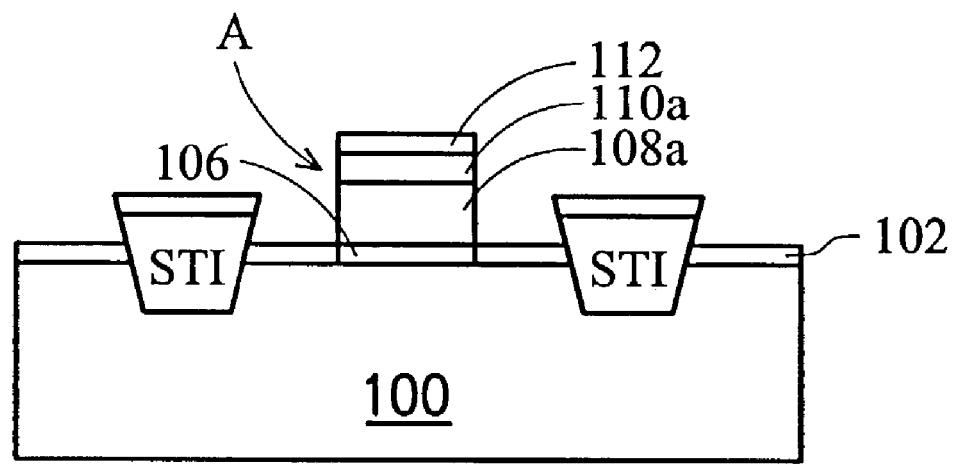

Finally, as shown in FIG. 9, the dielectric layer 104 composed of TEOS is wet-etched to leave a gate A, and from the bottom to the top, the gate A comprises a gate dielectric layer 106, a first conductive layer 108a, a second conductice layer 110a, and a nitride layer 112.

Figure 10:
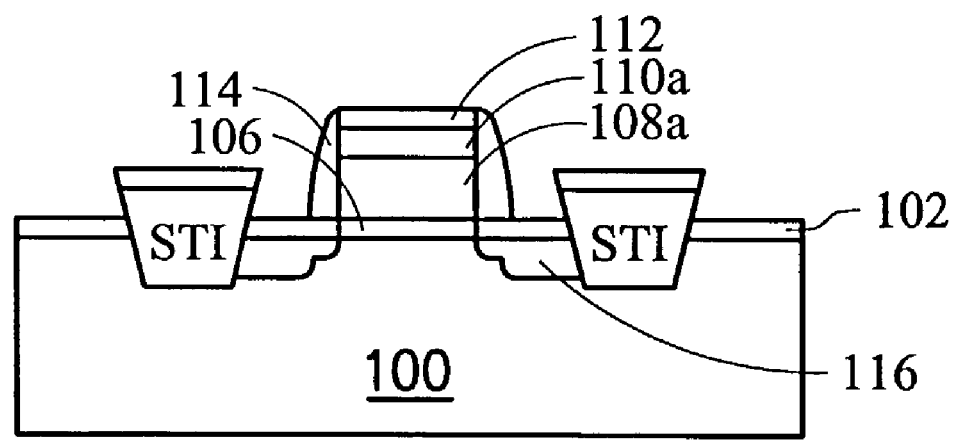

After the gate structure is formed, as shown in FIG. 10, ion-implantation is performed on the substrate 100 with the LDD photoresist as an implant mask to form LDD doping area 116, and sidewall spacer 114 is then formed. Source/drain doping area is then formed with source/drain photoresist and implantation. Accordingly, the MOSFET gate structure of the present invention is achieved. For DRAM, phosphorous is preferred for source/drain in array transistor to reduce circuit leakage from implant damage. While arsenic ion is used for source/drain doping area 116, it is performed with implant energy of 1~100 KeV and the implant dosage of 1E15~8E15 atoms/$cm^2$.

In conclusion, damascene process, heretofore employed only in connecting wires, allows the present invention's manufacture of a gate to be applied beyond 0.1 μm technology. In addition, no hard mask is utilized in the present invention, so process is simplified and difficulties in making hard masks are bypassed. Moreover, gate trench etching is easier with the present invention.

Other advantages include a flatter gate line structure since many layers are treated by CMP in the method of the present invention. The gate structure obtained in the present invention is refined without poor contact.

Furthermore, each gate is manufactured with the deposited dielectric layers in the present invention, avoiding short circuit in the gate to gate stringer as encountered in conventional manufacture. In addition, gate to bitline stringers which may occur on the silicon substrate can be avoided, an important consideration in DRAM application.

While the invention has been particularly shown and described with the reference to the preferred embodiments thereof, it will be understood by those skilled in the art that various changes in form and details may be made without departing from the spirit and scope of the invention.

What is claimed is:

1. A manufacturing method for a MOSFET gate structure, comprising:
   providing a substrate;
   sequentially depositing a pad layer and a dielectric layer thereon;
   defining a gate trench passing through the dielectric layer and the pad layer to expose a predetermined gate area of the substrate;
   sequentially forming a gate dielectric layer, a gate conductive layer, and a cap layer on the exposed substrate to form a damascene gate structure in the gate trench, and
   removing the dielectric layer.

2. The method as claimed in claim 1, wherein the pad layer comprises an oxide layer on the substrate and a nitride layer on the oxide layer.

3. The method as claimed in claim 1, wherein the dielectric layer is tetra-ethyl-ortho-silicate (TEOS).

4. The method as claimed in claim 1, wherein the gate trench is formed by:
   forming a photoresist layer on the dielectric layer with a pattern of the predetermined gate area;
   removing the dielectric layer and the pad layer above the predetermined gate area using the pattern as a mask; and
   removing the photoresist layer.

5. The method as claimed in claim 1, wherein the damascene gate structure is formed by:
   forming the gate dielectric layer,
   filling the gate trench with a gate conductive layer and recessing the same to leave a damascene conductive layer,
   filling the gate trench with a cap layer and recessing the same to leave a damascene cap layer.

6. The method as claimed in claim 5, wherein the gate dielectric layer is formed by CVD, PVD, or MBE.

7. The method as claimed in claim 6, wherein the gate dielectric layer is $Al_2O_3$ or $HfO_2$.

8. The method as claimed in claim 5, wherein the recessing is performed by chemical mechanical polishing, etching back, or a combination thereof.

9. The method as claimed in claim 5, wherein the gate conductive layer is polysilicon or metal.

10. The method as claimed in claim 9, wherein the metal gate conductive layer is Al or Mo.

11. The method as claimed in claim 5, wherein the gate gate conductive layer comprises a first conductive layer on the dielectric layer, and a second conductive layer on the first conductive layer.

12. The method as claimed in claim 11, wherein the first conductive layer is thicker than the second conductive layer.

13. The method as claimed in claim 12, wherein the first conductive layer is a N-type polysilicon layer, and the second conductive layer is a tungsten silicide layer.

14. The method as claimed in claim 12, wherein the first conductive layer is a N-type polysilicon layer and the second conductive layer is a tungsten nitride/tungsten layer.

15. The method as claimed in claim 1, wherein the dielectric layer is removed by wet etching.

16. The method as claimed in claim 1, wherein the cap layer is a nitride layer.

17. A manufacturing method for a MOSFET gate structure, comprising:
   providing a silicon substrate;
   depositing a pad layer and a dielectric layer sequentially thereon;

defining a gate trench passing through the dielectric layer and the pad layer to expose a predetermined gate area of the substrate;

sequentially forming a gate dielectric layer, a first conductive layer, a second conductive layer, and a cap layer on the exposed substrate in the gate trench to form a damascene gate structure, wherein the damascene gate structure is formed by:

forming the gate dielectric layer, filling the gate trench with a first conductive layer and recessing the same to leave a damascene first conductive layer, filling the gate trench with a second conductive layer and recessing the same to leave a damascene second conductive layer, and filling the gate trench with a cap layer and recessing the same to leave a damascene cap layer; and finally, removing the dielectric layer.

18. The method as claimed in claim 17, wherein the pad layer comprises an oxide layer on the substrate and a nitride layer on the oxide layer.

19. The method as claimed in claim 17, wherein the dielectric layer is tetra-ethyl-ortho-silicate (TEOS).

20. The method as claimed in claim 17, wherein the gate trench is formed by:

forming a photoresist layer on the dielectric layer with a pattern of the predetermined gate area;

removing the dielectric layer and the pad layer above the predetermined gate area using the pattern as a mask; and removing the photoresist layer.

21. The method as claimed in claim 17, wherein the gate dielectric layer is formed by thermal oxidation.

22. The method as claimed in claim 17, wherein the recessing is performed by chemical mechanical polishing, etching back, or a combination thereof.

23. The method as claimed in claim 17, wherein the first conductive layer is thicker than the second conductive layer.

24. The method as claimed in claim 23, wherein the first conductive layer is a N-type polysilicon layer, and the second conductive layer is a tungsten silicide layer.

25. The method as claimed in claim 23, wherein the first conductive layer is a N-type polysilicon layer, and the second conductive layer is a tungsten nitride/tungsten layer.

26. The method as claimed in claim 17, wherein the cap layer is a nitride layer.

* * * * *